US 10,715,152 B2

(12) United States Patent
Kubo et al.

(10) Patent No.: US 10,715,152 B2
(45) Date of Patent: Jul. 14, 2020

(54) PLL CIRCUIT

(71) Applicant: THINE ELECTRONICS, INC., Tokyo (JP)

(72) Inventors: Shunichi Kubo, Tokyo (JP); Yusuke Fujita, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 16/419,222

(22) Filed: May 22, 2019

(65) Prior Publication Data

US 2019/0363722 A1 Nov. 28, 2019

(30) Foreign Application Priority Data

May 25, 2018 (JP) .................. 2018-100567

(51) Int. Cl.
*H03L 7/099* (2006.01)
*H03L 7/097* (2006.01)

(52) U.S. Cl.
CPC .............. *H03L 7/099* (2013.01); *H03L 7/097* (2013.01)

(58) Field of Classification Search
CPC ................................ H03L 7/099; H03L 7/097
See application file for complete search history.

(56) References Cited

U.S. PATENT DOCUMENTS

| 5,382,922 | A  | * | 1/1995  | Gersbach | ................. | H03L 1/00 |
|           |    |   |         |          |                   | 331/1 A   |
| 6,873,670 | B1 | * | 3/2005  | Chiu     | ................. | H03L 7/197|
|           |    |   |         |          |                   | 327/148   |
| 6,952,124 | B2 | * | 10/2005 | Pham     | ................. | H03L 7/099|
|           |    |   |         |          |                   | 327/148   |
| 7,099,643 | B2 | * | 8/2006  | Lin      | ................. | H03L 7/097|
|           |    |   |         |          |                   | 455/147   |
| 7,102,446 | B1 |   | 9/2006  | Lee et al. |                 |           |
| 7,133,485 | B1 | * | 11/2006 | Baird    | ................. | H03L 7/099|
|           |    |   |         |          |                   | 375/376   |
| 7,420,427 | B2 | * | 9/2008  | Brown    | ................. | H03L 7/0893|
|           |    |   |         |          |                   | 331/10    |
| 7,432,768 | B2 | * | 10/2008 | Han      | ................. | H03B 5/1841|
|           |    |   |         |          |                   | 331/117 FE|

(Continued)

FOREIGN PATENT DOCUMENTS

JP        2003-078410 A      3/2003

*Primary Examiner* — Thomas J. Hiltunen
(74) *Attorney, Agent, or Firm* — Sughrue Mion, PLLC

(57) ABSTRACT

A PLL circuit of one embodiment has a structure for preferably setting the FV characteristic of an LC-VCO. The PLL circuit includes a voltage controlled oscillator, a phase comparator, a charge pump, a loop filter, and an FV characteristic adjustment unit setting the FV characteristic. The voltage controlled oscillator has an FV characteristic indicating the relationship between a control signal and a frequency and outputs an oscillation signal having a frequency corresponding to the control signal based on the FV characteristic. The phase comparator detects a phase difference between an input signal and the control signal. The charge pump outputs a corrected voltage value changed according to the phase difference. The loop filter outputs a control voltage value changed in response to corrected voltage value variations. The FV characteristic adjustment unit generates an FV characteristic control signal by a mean corrected voltage value.

3 Claims, 11 Drawing Sheets

(56) References Cited

U.S. PATENT DOCUMENTS

| | | | | |
|---|---|---|---|---|
| 8,373,460 B2 * | 2/2013 | Sinha | ................... | H03L 7/089 |
| | | | | 327/150 |
| 8,704,566 B2 * | 4/2014 | Ainspan | ................ | H03L 7/087 |
| | | | | 327/149 |
| 9,094,026 B2 * | 7/2015 | Canard | ................ | H03L 7/0992 |
| 9,413,366 B2 * | 8/2016 | Shanan | ................ | H03L 7/099 |
| 9,485,085 B2 * | 11/2016 | Arcudia | ................ | H03L 7/091 |
| 10,056,911 B2 * | 8/2018 | Rombach | ................ | H03L 7/099 |

\* cited by examiner

PLL CIRCUIT

TECHNICAL FIELD

The present invention relates to a PLL circuit.

BACKGROUND ART

Typically, a PLL (Phase Locked Loop) circuit includes a phase comparator, a charge pump, a loop filter, and a voltage controlled oscillator (hereinbelow, also referred to as a "VCO"), and these members constitute a loop. The PLL circuit is used as a frequency synthesizer which outputs an oscillation signal having a frequency that is a constant multiple of the frequency of an input oscillation signal. Further, the PLL circuit is capable of recovering a clock embedded in an input digital signal in a CDR (Clock Data Recovery) device.

The PLL circuit operates as described below. When a control voltage value is inputted to the voltage controlled oscillator, an oscillation signal having a frequency corresponding to the control voltage value is outputted from the voltage controlled oscillator. The oscillation signal outputted from the voltage controlled oscillator or a signal obtained by frequency-dividing the oscillation signal, is inputted as a feedback oscillation signal to the phase comparator. Further, another input signal (an oscillation signal or a digital signal) is also inputted to the phase comparator in addition to the feedback oscillation signal. In the phase comparator, a phase difference between the input signal and the feedback oscillation signal is detected, and a phase difference signal indicating the detected phase difference is outputted to the charge pump.

In the charge pump to which the phase difference signal has been inputted, a current flows between the loop filter and the charge pump so that the phase difference indicated by the phase difference signal is reduced. The loop filter includes a capacitive element having a charge storage amount increased or reduced by a charge transfer from the charge pump side (a charging current) or a charge transfer toward the charge pump side (a discharging current) and maintains a charge storage amount corresponding to an output side voltage value of the charge pump. The loop filter outputs a control voltage value corresponding to the charge storage amount to the voltage controlled oscillator. When the control voltage value outputted from the loop filter is inputted to the voltage controlled oscillator, an oscillation signal having a frequency corresponding to the control voltage value is outputted from the voltage controlled oscillator.

In the PLL circuit having the loop as described above, the control voltage value outputted to the voltage controlled oscillator from the loop filter converges to a certain value so that the phase difference detected by the phase comparator is reduced. The voltage controlled oscillator outputs an oscillation signal having a frequency that is a constant multiple of the frequency of the input oscillation signal or a clock embedded in an input digital signal after the clock is recovered.

There are various types of oscillators as the voltage controlled oscillator. Among the various types of oscillators, an LC-VCO includes an inductor and a capacitor, and outputs an oscillation signal having a frequency corresponding to an input control voltage value using a resonance phenomenon by the inductor and the capacitor. As compared to the other types of voltage controlled oscillators, jitter is small in the LC-VCO. Thus, when the frequency is 10 Gbps or more, it is essential to use the LC-VCO among various types of voltage controlled oscillators.

As compared to the other types of voltage controlled oscillators, changes in the frequency of the output oscillation signal in response to changes in the control voltage value are small in the LC-VCO. In the LC-VCO, an FV characteristic which determines the relationship between the frequency (F) of the output oscillation signal and the control voltage value (V) depends on a capacitance value of the capacitor. Further, the range of the control voltage value inputted to the LC-VCO is limited. When the control voltage value falls outside the range, a proportional relationship in frequency between input and output is not satisfied.

The frequency of a transferred signal may vary with time by spread spectrum (hereinbelow, referred to as "SS"). When the frequency of a signal is constant, an energy of an electromagnetic wave radiated from the signal is concentrated on the frequency. Thus, there is a problem of electro magnetic interference (hereinbelow, referred to as "EMI"). On the other hand, when the frequency of a signal is intentionally modulated by SS, an energy of an electromagnetic wave radiated from the signal has an expanded frequency band and a small peak. The problem of EMI can be reduced by SS. When the bit rate of a signal is high or a transfer distance of a signal is long, it is desired to modulate the frequency of the signal by SS. The degree of modulation of frequency by SS may require ±1.0% or more.

For example, a serializer device which converts parallel data to serial data latches the parallel data at the timing designated by a first clock having a low frequency and outputs the serial data at the timing designated by a second clock having a high frequency. In such a serializer device, SS may be applied to the output serial data. In this case, a PLL circuit used in the serializer device takes in a first clock to which SS is applied, generates a second clock having a frequency that is a constant multiple of the frequency of the first clock and to which SS is applied, and outputs the generated second clock.

When the bit rate of serial data is high and the frequency of the second clock is high, as described above, an LC-VCO is preferably used as a voltage controlled oscillator included in the PLL circuit. However, when the modulation of frequency by SS in the first clock inputted to the PLL circuit is large, variations in a control voltage value inputted to the LC-VCO also become large. Under such a condition, the frequency of the second clock outputted from the PLL circuit is not in proportion to the frequency of the first clock. In order to avoid such a situation, it is important to appropriately set the capacitance value of the capacitor and appropriately set the FV characteristic of the voltage controlled oscillator in the LC-VCO.

Japanese Patent Application Laid-Open No. 2003-78410 (Patent Document 1) and U.S. Pat. No. 7,102,446 (Patent Document 2) disclose inventions intended to appropriately set the FV characteristic. In the invention disclosed in Patent Document 1, a capacitance value of a capacitor is set in an LC-VCO so that the frequency of a first clock and the frequency of a second clock are constantly in a proportional relationship in the range of frequency variations of the first clock. In the invention disclosed in Patent Document 2, a capacitance value of a capacitor is set in an LC-VCO so that a control voltage value inputted to the LC-VCO constantly falls within a predetermined range in the range of frequency variations of the first clock.

SUMMARY

The inventors have made a study of the above conventional techniques and found out the following problems.

That is, in the invention disclosed in Patent Document 1, even when the FV characteristic of the LC-VCO is appropriate at the beginning after setting, the FV characteristic of the LC-VCO may be deteriorated when the voltage or the temperature varies. That is, the invention disclosed in Patent Document 1 may not be able to ensure a sufficient voltage/temperature (VT) drift margin.

In the invention disclosed in Patent Document 2, when a range where the control voltage value inputted to the LC-VCO is monitored is wide, the FV characteristic may be deteriorated as with the invention disclosed in Patent Document 1. On the contrary, when the frequency modulation by SS is large under the condition that the range where the control voltage value inputted to the LC-VCO is monitored is narrow and the range of variations in the control voltage value is large, an FV characteristic in which the control voltage value constantly falls within the predetermined range may not be obtained. When an FV characteristic in which the control voltage value falls outside the predetermined range under the condition that the range where the control voltage value inputted to the LC-VCO is monitored is narrow is selected, the selected FV characteristic is not always a preferred one.

The present invention has been made to solve the above problems, and an object thereof is to provide a PLL circuit provided with an LC-VCO as a voltage controlled oscillator and a configuration for enabling more preferred setting of the FV characteristic of the LC-VCO.

A PLL circuit of the present invention comprises: at least, a voltage controlled oscillator; a phase comparator; a charge pump; a loop filter; and an FV characteristic adjustment unit. The voltage controlled oscillator includes an inductor and a capacitor, and outputs an oscillation signal having a frequency corresponding to an input control voltage value using a resonance phenomenon by the inductor and the capacitor. The FV characteristic of the voltage controlled oscillator that determines the relationship between the control voltage and the frequency, is set according to an FV characteristic control signal. The phase comparator takes in the oscillation signal outputted from the voltage controlled oscillator or a signal obtained by frequency-dividing the oscillation signal as a feedback oscillation signal and an input signal. The phase comparator detects a phase difference between the feedback oscillation signal and the input signal, and outputs a phase difference signal indicating the detected phase difference. The charge pump takes in the phase difference signal outputted from the phase comparator, and outputs a corrected voltage value that reduces the phase difference indicated by the phase difference signal. The loop filter takes in the corrected voltage value outputted from the charge pump, and outputs the control voltage value increased or reduced according to the corrected voltage value. The FV characteristic adjustment unit generates the FV characteristic control signal for adjusting the FV characteristic of the voltage controlled oscillator on the basis of a mean value of the corrected voltage value outputted from the charge pump.

DETAILED DESCRIPTION

Figure 1:
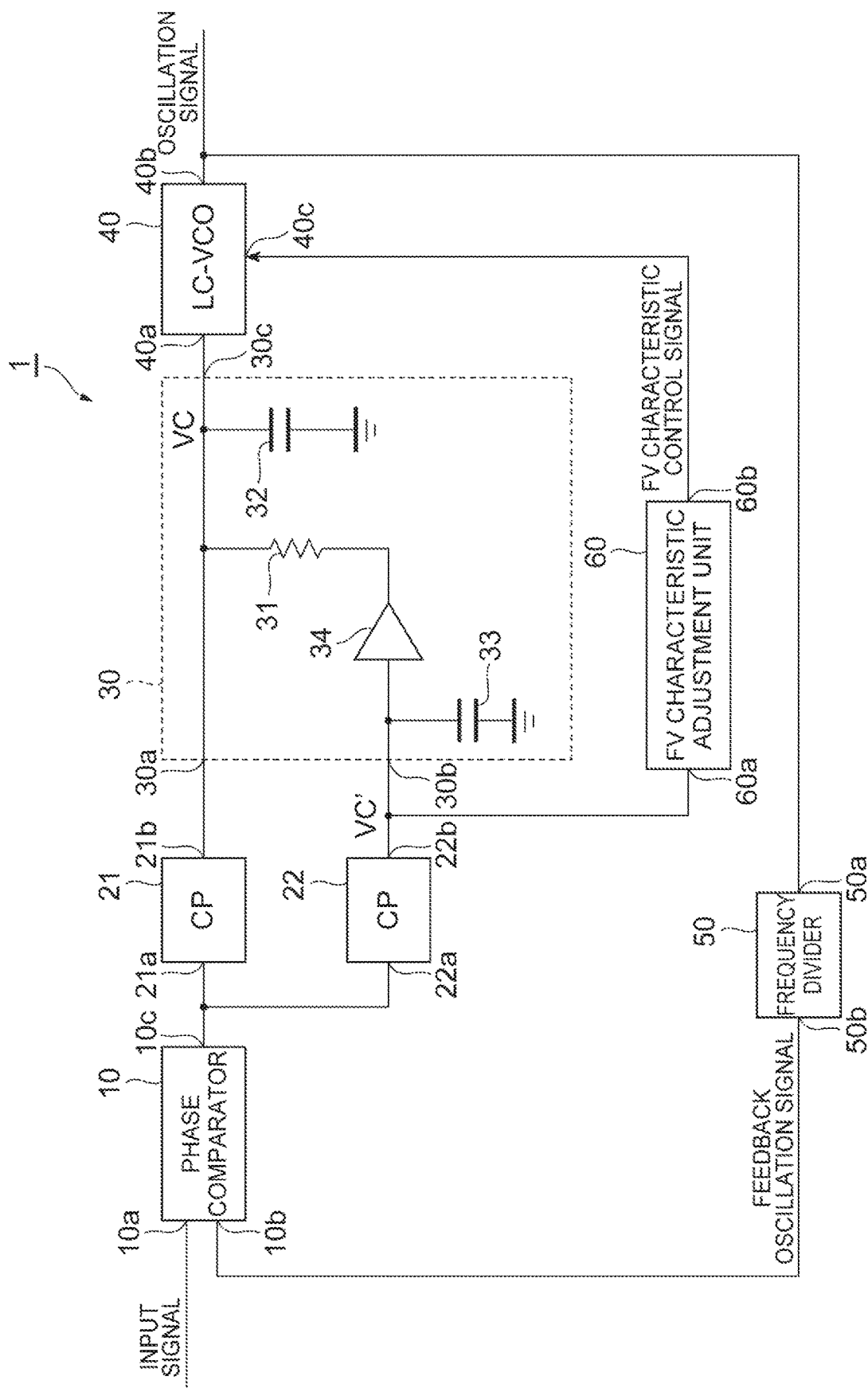
FIG. 1 is a diagram illustrating the configuration of a PLL circuit 1.

Description of Embodiment of the Present Invention

First, details of an embodiment of the present invention will be individually listed and described.

(1) A PLL circuit according to the present embodiment comprises: as an aspect, a voltage controlled oscillator; a phase comparator; a charge pump; a loop filter; and an FV characteristic adjustment unit. The voltage controlled oscillator includes an inductor and a capacitor, and generates an oscillation signal using a resonance phenomenon by the inductor and the capacitor. The voltage controlled oscillator further includes a first input end provided to take in a control voltage value, an output end provided to output an oscillation signal having a frequency corresponding to the taken-in control voltage value, and a second input end provided to take in an FV characteristic control signal for adjusting an FV characteristic that determines a relationship between the frequency and the control voltage value. The phase comparator includes a first input end provided to take in an input signal, a second input end electrically connected to the output end of the voltage controlled oscillator and provided to taken-in a feedback oscillation signal, and an output end provided to output a phase difference signal. The feedback oscillation signal includes the oscillation signal outputted from the voltage controlled oscillator or a signal obtained by frequency-dividing the oscillation signal. The phase difference signal indicates a phase difference detected between the taken-in feedback oscillation signal and the taken-in input signal. The charge pump includes an input end electrically connected to the output end of the phase comparator and provided to take in the phase difference signal, and an output end provided to output a corrected voltage value that reduces the phase difference indicated by the taken-in phase difference signal. The loop filter includes an input end electrically connected to the output end of the charge pump and provided to take in the corrected voltage value, and an output end provided to output the control voltage value increased or reduced in response to variations in the taken-in corrected voltage value. The FV characteristic adjustment unit generates the FV characteristic control signal for adjusting the FV characteristic of the voltage controlled oscillator on the basis of a mean value of the corrected voltage value. The FV characteristic adjustment unit includes an input end electrically connected to the output end of the charge pump and provided to take in the corrected voltage value, and an output end electrically connected to the second input end of the voltage controlled oscillator and provided to output the FV characteristic control signal.

(2) As an aspect of the present embodiment, the FV characteristic adjustment unit preferably outputs the FV characteristic control signal for adjusting the FV characteristic so that a difference between the mean value of the corrected voltage value and a reference voltage value becomes a predetermined threshold or less. As an aspect of the present embodiment, the FV characteristic adjustment unit may output the FV characteristic control signal for adjusting the FV characteristic so that the mean value of the corrected voltage value falls between a predetermined lower limit value and a predetermined upper limit value. Further, as an aspect of the present embodiment, the FV characteristic adjustment unit may obtain a mean value of a maximum value and a minimum value of the corrected voltage value as the mean value of the corrected voltage value.

Each of the modes listed in the [Description of Embodiment of the Present Invention] is applicable to all the other modes or all combinations of the other modes.

Details of Embodiment of the Present Invention

Hereinbelow, a specific structure of the PLL circuit according to the present embodiment will be described with reference to the accompanying drawings. Note that the present invention is not limited to the following examples, and it is intended that the present invention is defined by the claims and includes all changes within the meaning and range equivalent to the claims. In the following description, identical elements are designated by the same reference signs throughout the drawings to omit redundant description.

FIG. 1 is a diagram illustrating the configuration of a PLL circuit 1. The PLL circuit 1 is provided with a phase comparator 10, a charge pump 21, a charge pump 22, a loop filter 30, a voltage controlled oscillator 40, a frequency divider 50, and an FV characteristic adjustment unit 60. The phase comparator 10 includes an input end (first input end) 10a for taking in an input signal, an input end (second input end) 10b for taking in a feedback oscillation signal, and an output end 10c for outputting a phase difference signal. The charge pump 21 includes an input end 21a which is electrically connected to the output end 10c, and an output end 21b for outputting a corrected voltage value VC'. The charge pump 22 includes an input end 22a which is electrically connected to the output end 10c, and an output end 22b for outputting the corrected voltage value VC'. The phase difference signal is taken in into the charge pumps 21, 22 through the input ends 21a, 22a, respectively. The loop filter 30 includes input ends 30a, 30b which are electrically connected to the output ends 21b, 22b of the charge pumps 21, 22, respectively, and an output end 30c for outputting a control voltage value VC. The voltage controlled oscillator 40 includes an input end (first input end) 40a which is electrically connected to the output end 30c, an output end 40b for outputting an oscillation signal, and an input end (second input end) 40c for taking in an FV characteristic control signal. The frequency divider 50 includes an input end 50a which is electrically connected to the output end 40b and an output end 50b which is electrically connected to the input end 10b. A signal obtained by frequency-dividing the oscillation signal by the frequency divider 50 is taken in into the phase comparator 10 through the output end 50b and the input end 10b. The oscillation signal outputted from the voltage controlled oscillator 40 may be directly inputted as a feedback oscillation signal to the input end 10b of the phase comparator 10 without going through the frequency divider 50. The FV characteristic adjustment unit 60 includes an input end 60a which is electrically connected to the output end 22b, and an output end 60b for outputting an FV characteristic control signal.

The voltage controlled oscillator 40 includes an inductor and a capacitor, and outputs an oscillation signal having a frequency corresponding to a control voltage value, the control voltage value being taken in from the loop filter 30 through the input end 40a, through the output end 40b by a resonance phenomenon by the inductor and the capacitor. In the voltage controlled oscillator 40, the FV characteristic which determines the relationship between the frequency (F) of the output oscillation signal and the control voltage value (V) is adjusted according to the FV characteristic control signal taken in through the input end 40c.

The phase comparator 10 takes in a signal obtained by frequency-dividing the oscillation signal outputted from the output end 40b of the voltage controlled oscillator 40 by N by the frequency divider 50 as a feedback oscillation signal through the input end 10b and takes in an input signal through the input end 10a. The frequency divider 50 may not be provided. In this case, the oscillation signal outputted from the output end 40b of the voltage controlled oscillator 40 serves as the feedback oscillation signal taken in into the phase comparator 10. The input signal taken in into the phase comparator 10 is a clock or may be a digital signal with a clock embedded therein. The phase comparator 10 detects a phase difference between the feedback oscillation signal and the input signal, and outputs a phase difference signal indicating the phase difference to the charge pumps 21, 22 through the output end 10c.

The charge pumps 21, 22 take in the phase difference signal outputted from the phase comparator 10 through the input ends 21a, 22a, respectively, and set the output ends 21b, 22b to a corrected potential that reduces the phase difference indicated by the phase difference signal. The charge pumps 21, 22 may have the same configuration.

The loop filter 30 takes in the corrected voltage value VC' from the output ends 21b, 22b of the charge pumps 21, 22 through the input ends 30a, 30b, and outputs a control voltage value increased or reduced in conjunction with variations in the corrected voltage value VC' to the voltage controlled oscillator 40 through the output end 30c. The loop filter 30 includes a resistor 31, a capacitor 32, a capacitor 33, and a buffer 34. The resistor 31 is disposed between the output end 21b of the charge pump 21 and an output end of the buffer 34. The capacitor 32 is disposed between the output end 21b of the charge pump 21 and the ground potential end, and has a charge storage amount increased or reduced by the generation of a charging current flowing from the charge pump 21 or a discharging current flowing into the charge pump 21. Accordingly, the control voltage value VC is adjusted to the corrected voltage value VC' at the output end 21b of the charge pump 21. The capacitor 33 is disposed between the output end 22b of the charge pump 22 and the ground potential end, and has a charge storage amount increased or reduced by the generation of a charging current flowing from the charge pump 22 or a discharging current flowing into the charge pump 22. An input end of the buffer 34 is connected to the output end 22b of the charge pump 22. A voltage value at the input end of the buffer 34 is adjusted to the corrected voltage value VC' at the output end 21b of the charge pump 21. An output end of the buffer 34 is connected to the resistor 31. The gain of the buffer 34 is 1.

The FV characteristic adjustment unit 60 generates an FV characteristic control signal for adjusting the FV characteristic of the voltage controlled oscillator 40 on the basis of the mean value of the corrected voltage value VC' taken in through the input end 60a and outputs the generated FV characteristic control signal to the voltage controlled oscillator 40 through the output end 60b. Details of the FV characteristic adjustment unit 60 will be described below.

Figure 2:
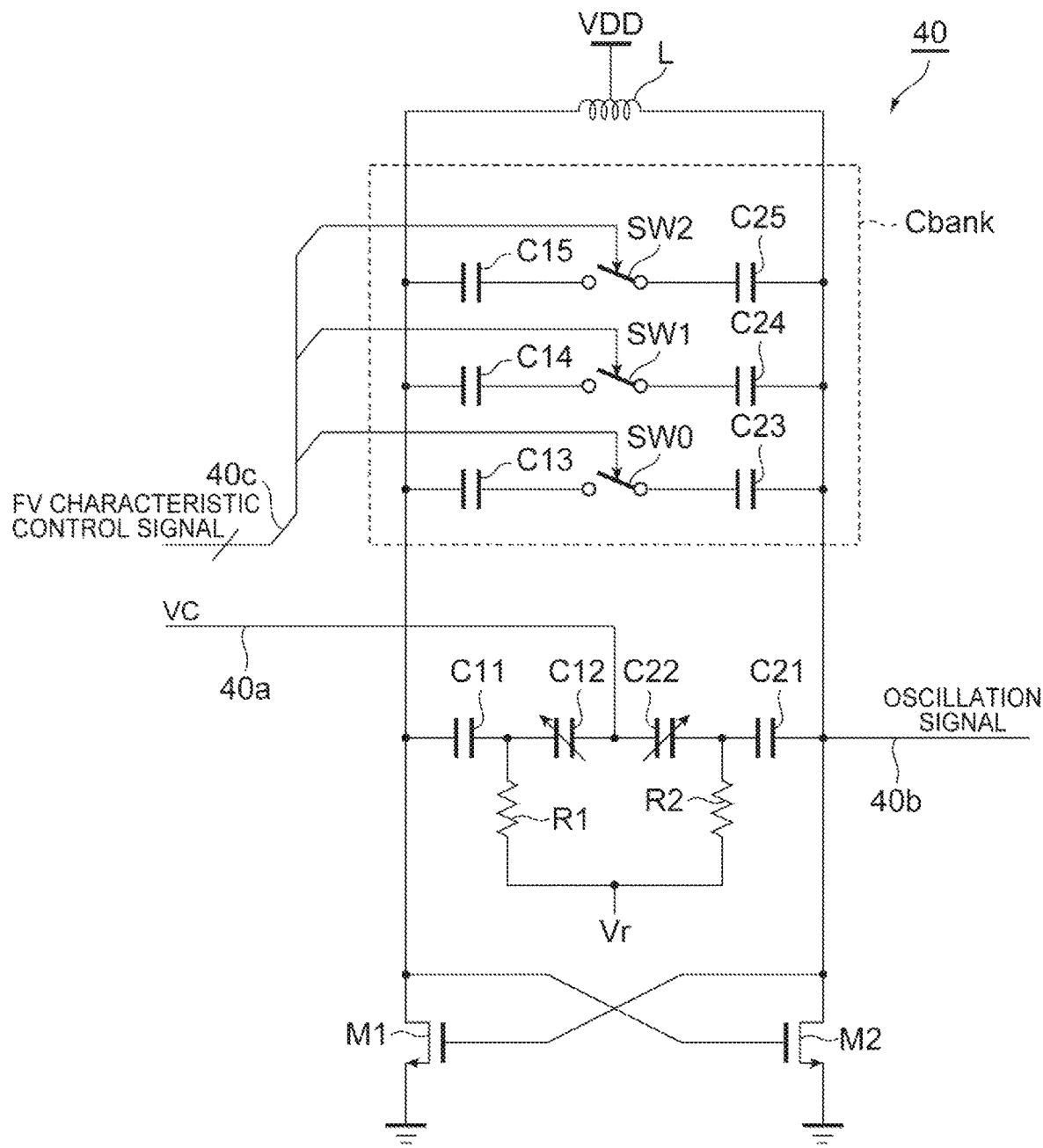
FIG. 2 is a circuit example of a voltage controlled oscillator 40.

FIG. 2 is a diagram illustrating a circuit example of the voltage controlled oscillator 40. In the circuit example illustrated in FIG. 2, the voltage controlled oscillator 40 includes NMOS transistors M1, M2, resistors R1, R2, capacitors C11 to C15, capacitors C21 to C25, switches SW0 to SW2, and an inductor L.

Each of sources of the NMOS transistors M1, M2 is connected to the ground potential end. A drain of the NMOS transistor M1 is connected to a gate of the NMOS transistor M2. A drain of the NMOS transistor M2 is connected to a gate of the NMOS transistor M1.

The capacitors C11, C12, C22, C21 are connected in series in this order and disposed between the drains of the NMOS transistors M1, M2. Capacitance values of the capacitors C12, C22 are variable. The resistors R1, R2 which are connected in series are disposed between a connection point between the capacitors C11, C12 and a connection point between the capacitors C21, C22. A voltage Vr is inputted to a connection point between the resistors R1, R2. A connection point between the capacitors C12, C22 is connected to the input end 40a for taking in the control voltage value VC.

The capacitor C13, the switch SW0, and the capacitor C23 are connected in series in this order and disposed between the drains of the NMOS transistors M1, M2. The capacitor C14, the switch SW1, and the capacitor C24 are connected in series in this order and disposed between the drains of the NMOS transistors M1, M2. The capacitor C15, the switch SW2, and the capacitor C25 are connected in series in this order and disposed between the drains of the NMOS transistors M1, M2. That is, the voltage controlled oscillator 40 includes a capacitor bank Cbank which is disposed between the input end 40a and the output end 40b. The capacitor bank Cbank includes a plurality of circuit elements each of which includes a switch and a plurality of capacitors which are disposed in series with the switch interposed therebetween, the circuit elements being disposed in parallel between the input end 40a and the output end 40b. For example, there are relationships as described below between capacitance values of the capacitors C13 to C15 and the capacitors C23 to C25, where C denotes the capacitance value of the capacitors C13, C23.

$$C15=C25=2^2C$$

$$C14=C24=2C$$

$$C13=C23=C$$

The inductor L is disposed between the drains of the NMOS transistors M1, M2. A power supply voltage VDD is applied to the inductor L. On/off of each of the three switches SW0 to SW2 is set according to the FV characteristic control signal from the FV characteristic adjustment unit 60. The FV characteristic control signal can be represented by three-bit data. The capacitance value of the entire capacitor bank Cbank including the capacitors C13 to C15 and the capacitors C23 to C25 is a capacitance value corresponding to the FV characteristic control signal (that is, an on/off setting state of each of the three switches SW0 to SW2). The control voltage value VC is inputted to the connection point between the capacitors C12, C22. An oscillation signal is outputted from the drain of the NMOS transistor M2. The frequency of the output oscillation signal is a frequency corresponding to the control voltage value VC. The FV characteristic is an FV characteristic corresponding to the FV characteristic control signal.

Figure 3:
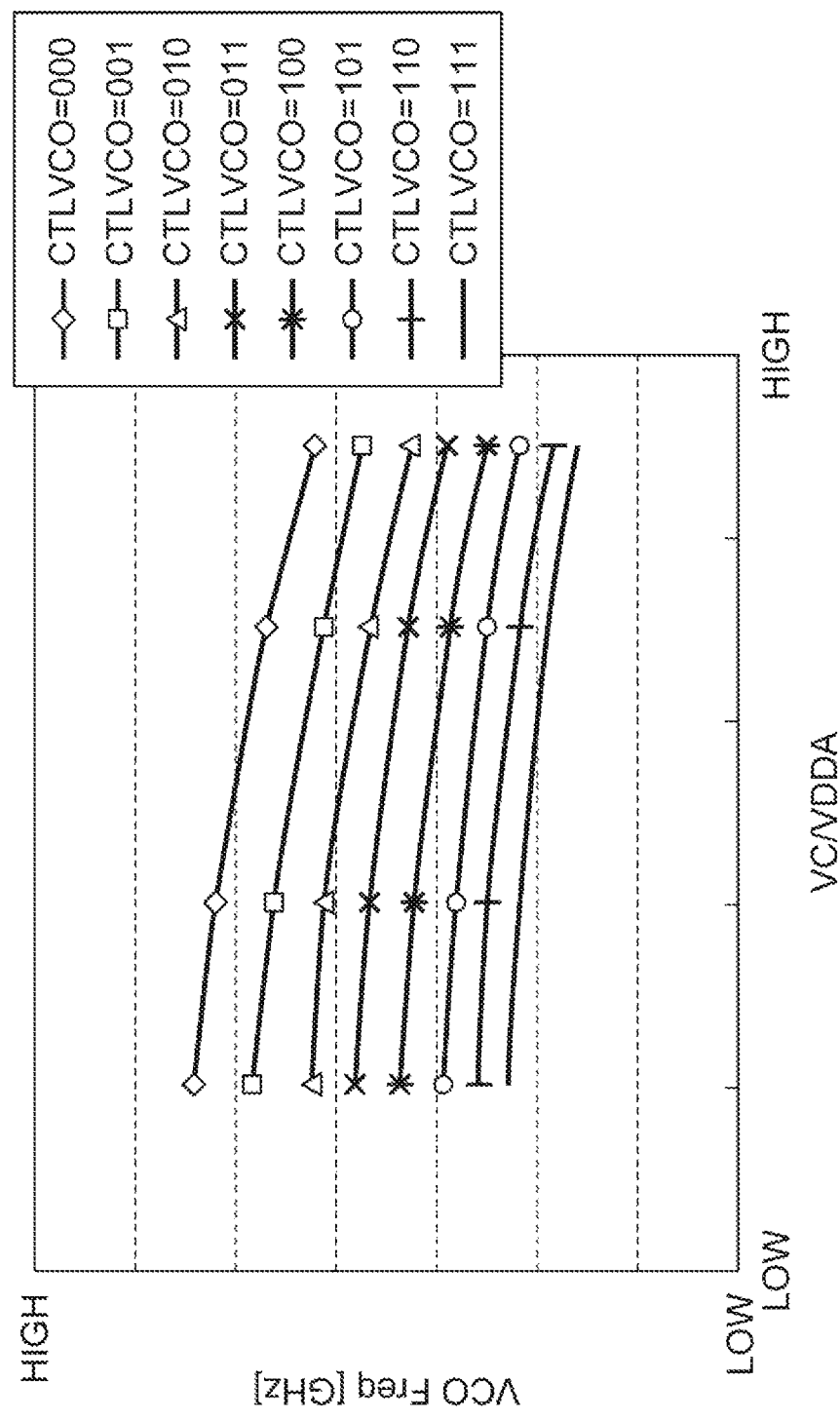
FIG. 3 is a diagram illustrating an example of the FV characteristic of the voltage controlled oscillator 40.

FIG. 3 is a diagram illustrating an example of the FV characteristic of the voltage controlled oscillator 40. The horizontal axis represents the ratio (with not unit) between the control voltage value VC and the power supply voltage VDD which are inputted to the voltage controlled oscillator 40. The vertical axis represents the frequency [GHz] of the oscillation signal outputted from the voltage controlled oscillator 40. The FV characteristic is illustrated for eight cases where a value of the three-bit FV characteristic control signal CTLVCO is 000 to 111 in the binary notation. As illustrated in FIG. 3, the voltage controlled oscillator 40 is capable of outputting an oscillation signal having a frequency corresponding to the input control voltage value VC and changing the FV characteristic according to the FV characteristic control signal.

Figure 4:
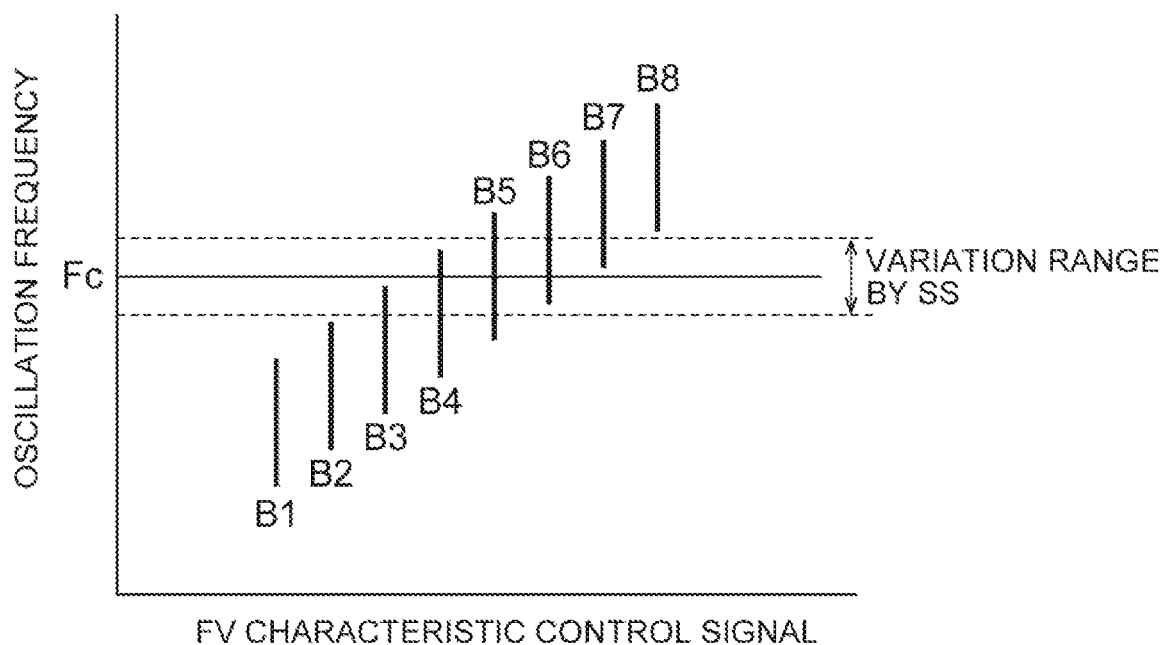
FIG. 4 is a diagram illustrating an example of a frequency band of an oscillation signal outputted from the voltage controlled oscillator 40.

FIG. 4 is a diagram illustrating an example of a frequency band of the oscillation signal outputted from the voltage controlled oscillator 40. The horizontal axis represents a value of the FV characteristic control signal inputted to the voltage controlled oscillator 40. The vertical axis represents the frequency of the oscillation signal outputted from the voltage controlled oscillator 40. In FIG. 4, B1 to B8 indicate frequency bands corresponding to the values (000 to 111 in the binary notation) of the FV characteristic control signal CTLVCO (in FIG. 4, the frequency band of the output oscillation signal corresponding to each value of the FV characteristic control signal is indicated by a line segment). As illustrated in FIGS. 3 and 4, the frequency band of the output oscillation signal varies according to a value of the FV characteristic control signal.

In FIG. 4, a median Fc of the frequency of the output oscillation signal in the case where SS is applied is indicated by a solid line, and the range of variations in the frequency of the output oscillation signal to which the SS is applied is indicated by broken lines. Among the eight bands B1 to B8 illustrated in FIG. 4, the bands B1, B2, B8 do not overlap the range of variations in the frequency of the output oscillation signal to which SS is applied at all. The bands B3, B4, B6, B7 include not the entire range of variations in the frequency of the output oscillation signal to which SS is applied, but only a part of the range. Thus, when any of the bands B1 to B4, B6 to B8 is selected according to the FV characteristic control signal, the frequency of the output oscillation signal is not in proportion to the frequency or the bit rate of the input signal.

On the other hand, the band B5 includes the entire range of variations in the frequency of the output oscillation signal to which SS is applied. Thus, when the band B5 is selected according to the FV characteristic control signal, the frequency of the output oscillation signal is in proportion to the frequency or the bit rate of the input signal. Thus, the selection of the band B5 is preferred. When there is a plurality of bands including the entire range of variations in the frequency of the output oscillation signal to which SS is applied, any of the bands may be selected. However, in order to ensure a sufficient VT (voltage/temperature) drift margin, it is preferred to select a more preferred band from the bands.

Thus, the FV characteristic adjustment unit 60 applies an appropriate FV characteristic control signal to the voltage controlled oscillator 40 to adjust the FV characteristic so that the difference between the mean value of the control voltage value (taken-in corrected voltage value) and a reference voltage value becomes a predetermined threshold or less. Alternatively, the FV characteristic adjustment unit 60 applies an appropriate FV characteristic control signal to the voltage controlled oscillator 40 to adjust the FV characteristic so that the mean value of the taken-in voltage value falls between a predetermined lower limit value and a predetermined upper limit value. The mean value of the taken-in voltage value may be the mean value of voltage values sampled at constant time intervals for a period of one SS cycle, a value obtained by dividing the integral of voltage values for a period of one SS cycle by the cycle, or a value of the mean of the maximum value and the minimum value of the voltage value for a simple configuration.

Figure 5:
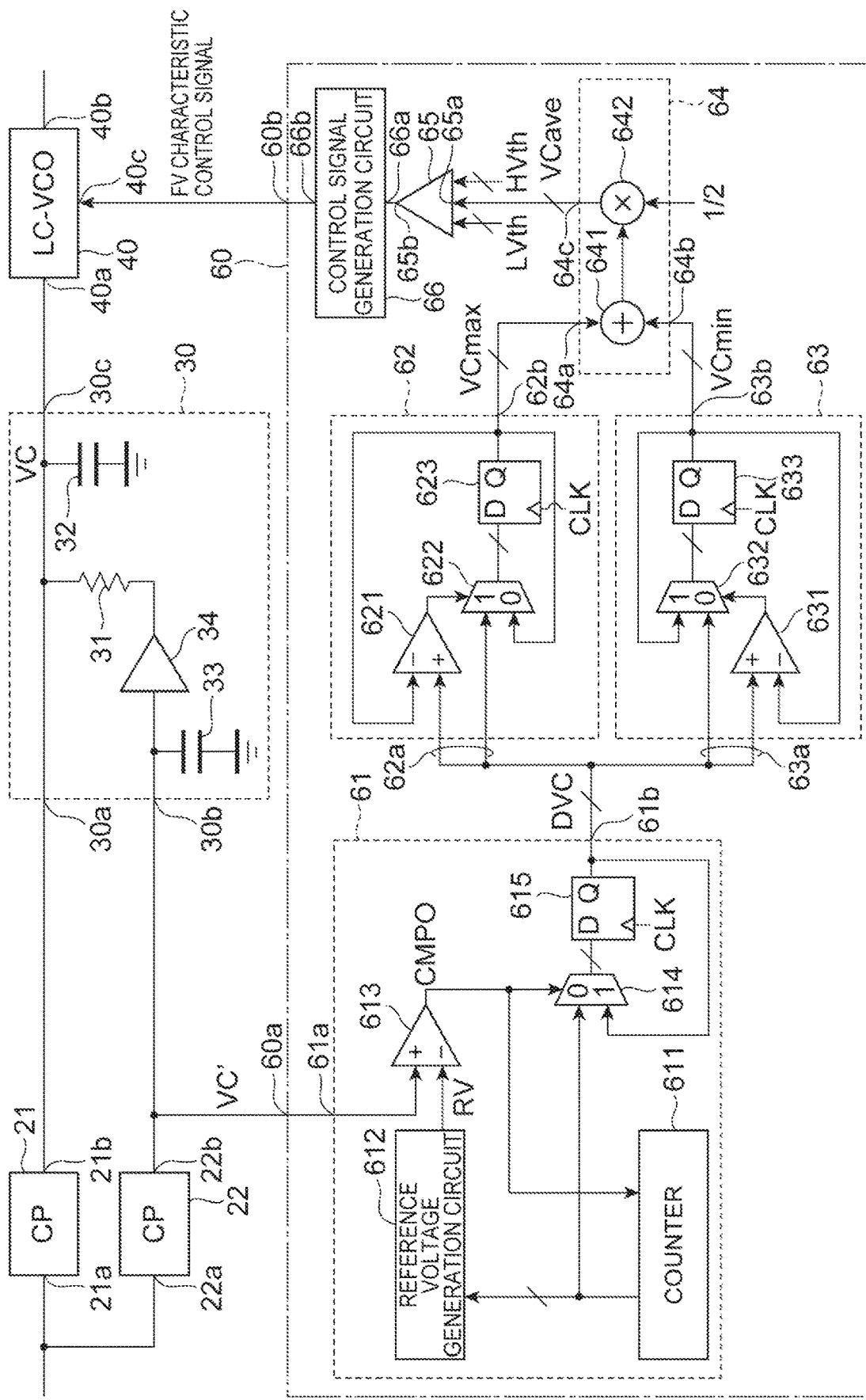
FIG. 5 is a diagram illustrating a circuit example of an FV characteristic adjustment unit 60.

FIG. 5 is a diagram illustrating a circuit example of the FV characteristic adjustment unit 60. FIG. 5 also illustrates the charge pumps 21, 22 and the voltage controlled oscillator 40. The FV characteristic adjustment unit 60 includes an AD conversion circuit 61, a maximum value detection circuit 62, a minimum value detection circuit 63, a mean value calculation circuit 64, a determination circuit 65, and a control signal generation circuit 66. The AD conversion circuit 61 includes an input end 61*a* which is connected to the input end 60*a* of the FV characteristic adjustment unit 60 and an output end 61*b*. The maximum value detection circuit 62 includes an input end 62*a* which is electrically connected to the output end 61*b*, and an output end 62*b*. The minimum value detection circuit 63 includes an input end 63*a* which is electrically connected to the output end 61*b*, and an output end 63*b*. The mean value calculation circuit 64 includes an input end 64*a* which is electrically connected to the output end 62*b*, an input end 64*b* which is electrically connected to the output end 63*b*, and an output end 64*c*. The determination circuit 65 includes an input end 65*a* (to which a lower limit value LVth and an upper limit value HVth are inputted) which is electrically connected to the output end 64*c*, and an output end 65*b*. The control signal generation circuit 66 includes an input end 66*a* which is electrically connected to the output end 65*b*, and an output end 66*b* which is electrically connected to the output end 60*b* of the FV characteristic adjustment unit 60.

The AD conversion circuit 61 takes in the corrected voltage value VC' as an analog value through the input end 61*a* and outputs a digital value DVC corresponding to the corrected voltage value VC' through the output end 61*b*. The AD conversion circuit 61 includes a counter 611, a reference voltage generation circuit 612, a comparator 613, a selector 614, and a latch circuit 615.

The counter 611 counts up from an initial value at constant time intervals and outputs the count value to the reference voltage generation circuit 612. The reference voltage generation circuit 612 takes in the count value outputted from the counter 611, generates a reference voltage value RV corresponding to the count value, and outputs the generated reference voltage value RV to the comparator 613. The comparator 613 takes in the reference voltage value RV outputted from the reference voltage generation circuit 612 and takes in the corrected voltage value VC'. When the reference voltage value RV exceeds the corrected voltage value VC', a signal CMPO outputted from the comparator 613 turns from a high level to a low level.

The counter 611 is initialized by the turn of the signal CMPO to the low level and counts up again from the initial value at constant time intervals. When the signal CMPO is in the high level, the selector 614 selects an output value from the latch circuit 615 and outputs the selected output value. When the signal CMPO is in the low level, the selector 614 selects an output value from the counter 611 and outputs the selected output value. The latch circuit 615 latches the output value from the selector 614 and outputs the latched output value. The digital value DVC outputted from the latch circuit 615 is a value corresponding to the corrected voltage value VC'.

The maximum value detection circuit 62 detects a maximum value VCmax of the digital values DVC sequentially outputted from the latch circuit 615 of the AD conversion circuit 61 and outputs the detected maximum value VCmax. The maximum value detection circuit 62 includes a comparator 621, a selector 622, and a latch circuit 623. The comparator 621 takes in the digital value DVC and an output value from the latch circuit 623, and makes a large-small comparison between these two values. When the comparator 621 determines that the digital value DVC is larger than the output value from the latch circuit 623, the selector 622 selects the digital value DVC and outputs the selected digital value DVC. When the comparator 621 determines that the digital value DVC is smaller than the output value from the latch circuit 623, the selector 622 selects the output value from the latch circuit 623 and outputs the selected output value. The latch circuit 623 latches the output value from the selector 622 and outputs the latched output value. The digital value VCmax outputted from the latch circuit 623 is a value corresponding to the maximum value of the corrected voltage value VC'.

The minimum value detection circuit 63 detects a minimum value VCmin of the digital values DVC sequentially outputted from the latch circuit 615 of the AD conversion circuit 61 and outputs the detected minimum value VCmin. The minimum value detection circuit 63 includes a comparator 631, a selector 632, and a latch circuit 633. The comparator 631 takes in the digital value DVC and an output value from the latch circuit 633, and makes a large-small comparison between these two values. When the comparator 631 determines that the digital value DVC is smaller than the output value from the latch circuit 633, the selector 632 selects the digital value DVC and outputs the selected digital value DVC. When the comparator 631 determines that the digital value DVC is larger than the output value from the latch circuit 633, the selector 632 selects the output value from the latch circuit 633 and outputs the selected output value. The latch circuit 633 latches the output value from the selector 632 and outputs the latched output value. The digital value VCmin outputted from the latch circuit 633 is a value corresponding to the minimum value of the corrected voltage value VC'. A reference clock CLK is inputted to each of the latch circuits 615, 623, 633, and the latch circuits 615, 623, 633 operate in synchronization with each other.

The mean value calculation circuit 64 takes in the maximum value VCmax outputted from the maximum value detection circuit 62 and takes in the minimum value VCmin outputted from the minimum value detection circuit 63. The mean value calculation circuit 64 obtains a mean value VCave (=(VCmax+VCmin)/2) of the maximum value VCmax and the minimum value VCmin and outputs the obtained mean value VCave. The mean value calculation circuit 64 includes an adder circuit 641 which adds the maximum value VCmax and the minimum value VCmin and outputs a value of the addition result and a multiplier circuit 642 which multiplies the addition result by ½ and outputs a value of the multiplication result. The value outputted from the multiplier circuit 642 is the mean value VCave of the maximum value VCmax and the minimum value VCmin.

The determination circuit 65 takes in the mean value VCave outputted from the mean value calculation circuit 64 and determines whether the mean value VCave falls between the predetermined lower limit value LVth and the predetermined upper limit value HVth. Alternatively, the determination circuit 65 may determine whether the difference between the mean value VCave and the reference voltage value is the predetermined threshold or less. The control signal generation circuit 66 generates an FV characteristic control signal applied to the voltage controlled oscillator 40 on the basis of a result of the determination by the determination circuit 65 and outputs the FV characteristic control signal to the voltage controlled oscillator 40. The control signal generation circuit 66 generates the FV characteristic control signal so that the mean value VCave falls between the lower limit value LVth and the upper limit value HVth or the difference between the mean value VCave and the reference voltage value is the predetermined threshold or less.

Figure 6:
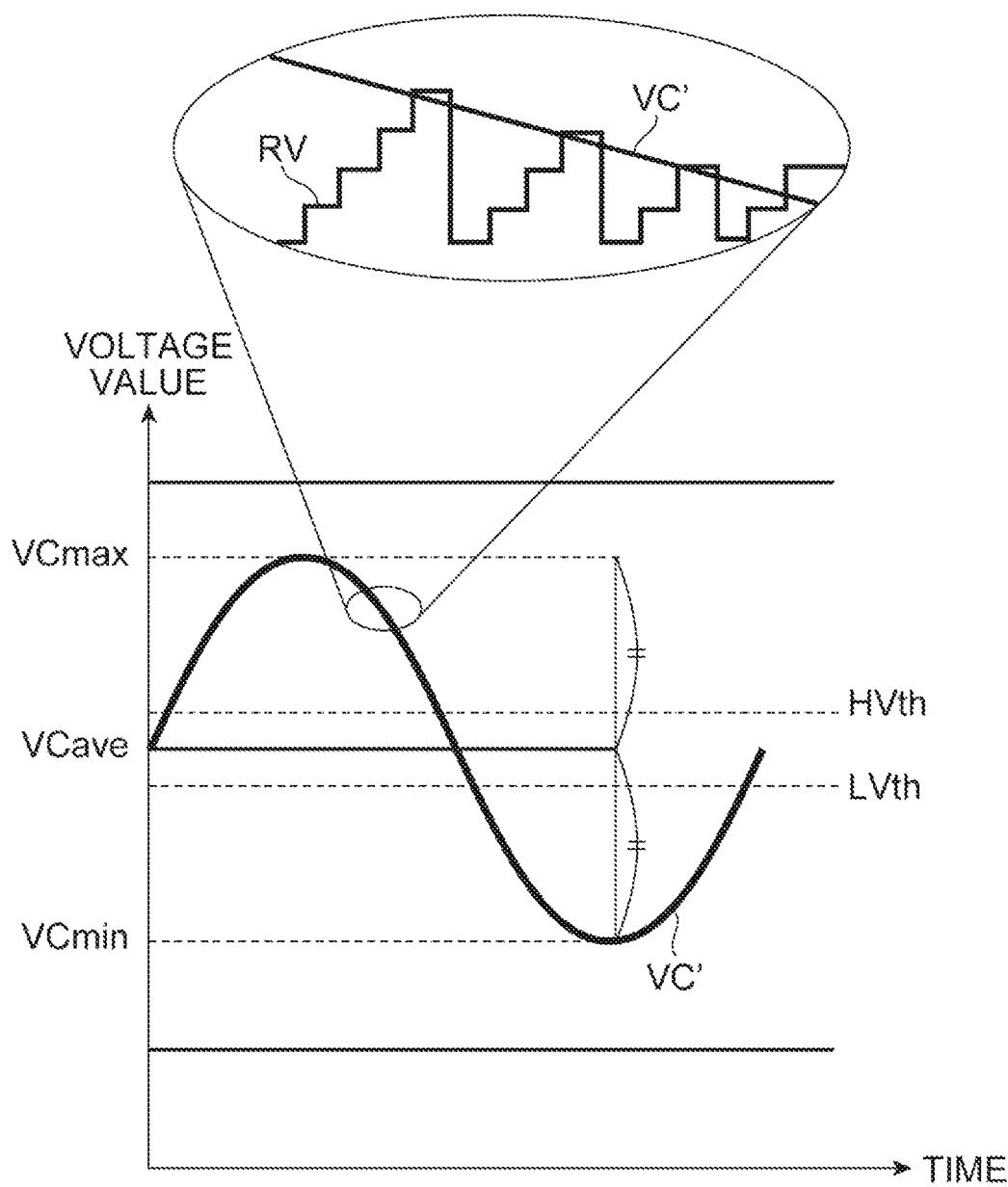
FIG. 6 is a diagram describing changes in each voltage value in the FV characteristic adjustment unit 60.

FIG. 6 is a diagram describing changes in each voltage value in the FV characteristic adjustment unit 60. FIG. 6 illustrates changes with time in the corrected voltage value VC' and variations with time in the reference voltage value RV outputted from the reference voltage generation circuit 612. Further, the changes with time in the corrected voltage value VC' and the changes with time in the reference voltage value RV are illustrated in a partially enlarged manner. As illustrated in FIG. 6, the reference voltage value RV increases in stages from an initial value, returns to the initial value when the reference voltage value RV exceeds the corrected voltage value VC', and increases again in stages from the initial value.

FIG. 6 also illustrates a level of the maximum value VCmax outputted from the maximum value detection circuit 62, a level of the minimum value VCmin outputted from the minimum value detection circuit 63, a level of the mean value VCave outputted from the mean value calculation circuit 64, and levels of the lower limit value LVth and the upper limit value HVth which are used in the determination by the determination circuit 65.

The lower limit value LVth and the upper limit value HVth are narrowly located across substantially the center of a variation range of the control voltage value VC and within a range in which the frequency band of the voltage controlled oscillator 40 is certainly present. Accordingly, the frequency band where the VT drift margin becomes maximum can be selected without depending on the SS intensity. The FV characteristic of the LC-VCO can be more preferably set.

In the configuration of the FV characteristic adjustment unit 60 described above, after the corrected voltage value VC' is converted to the digital value DVC by the AD conversion circuit 61, the maximum value VCmax, the minimum value VCmin, and the mean value VCave are obtained by digital processing, and the mean value VCave is determined. However, as illustrated in FIGS. 7 to 11, the maximum value VCmax, the minimum value VCmin, and the mean value VCave may be obtained from the control voltage value VC as an analog value by analog processing.

Figure 7:
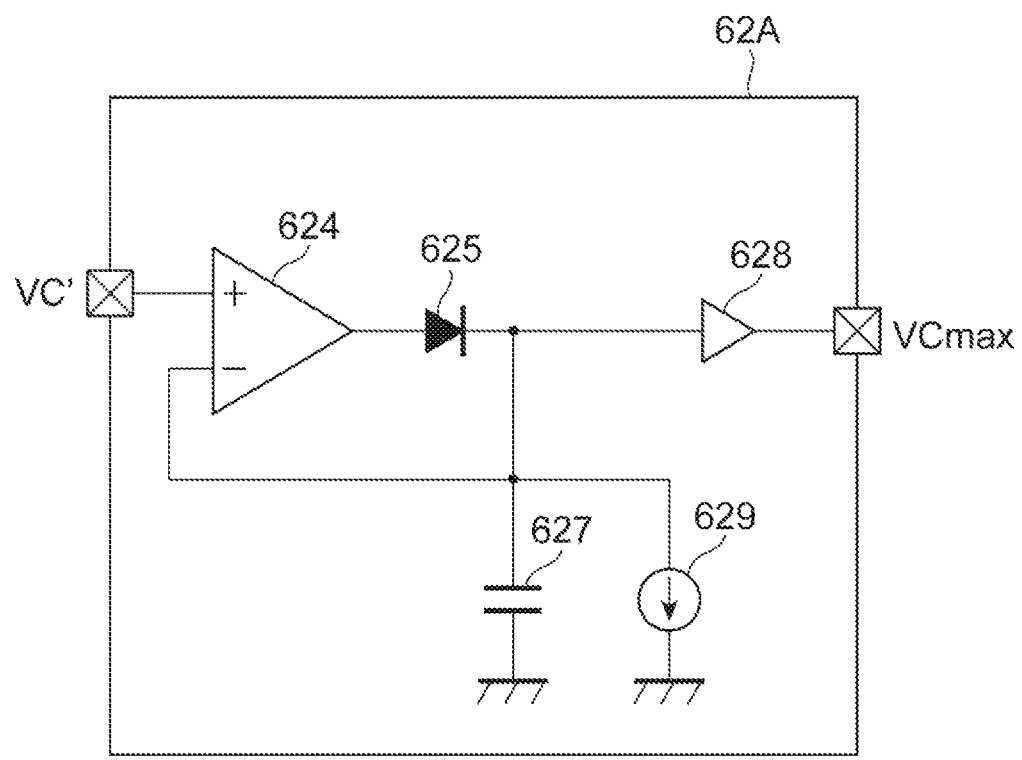
FIG. 7 is a diagram illustrating another configuration example of a maximum value detection circuit.

FIG. 7 is a diagram illustrating another configuration example of the maximum value detection circuit. A maximum value detection circuit 62A illustrated in FIG. 7 includes a differential amplifier 624, a diode 625, a capacitor 627, a buffer 628, and a current source 629. The control voltage value VC is inputted to a noninverting input terminal of the differential amplifier 624. An inverting input terminal of the differential amplifier 624 is connected to a cathode of the diode 625. An output terminal of the differential amplifier 624 is connected to an anode of the diode 625. The capacitor 627 is disposed between the cathode of the diode 625 and the ground potential end. The current source 629 is disposed between the cathode of the diode 625 and the ground potential end. An input end of the buffer 628 whose gain is 1 is connected to the cathode of the diode 625. The buffer 628 outputs the potential of the cathode of the diode 625 as the maximum value VCmax.

Figure 8:
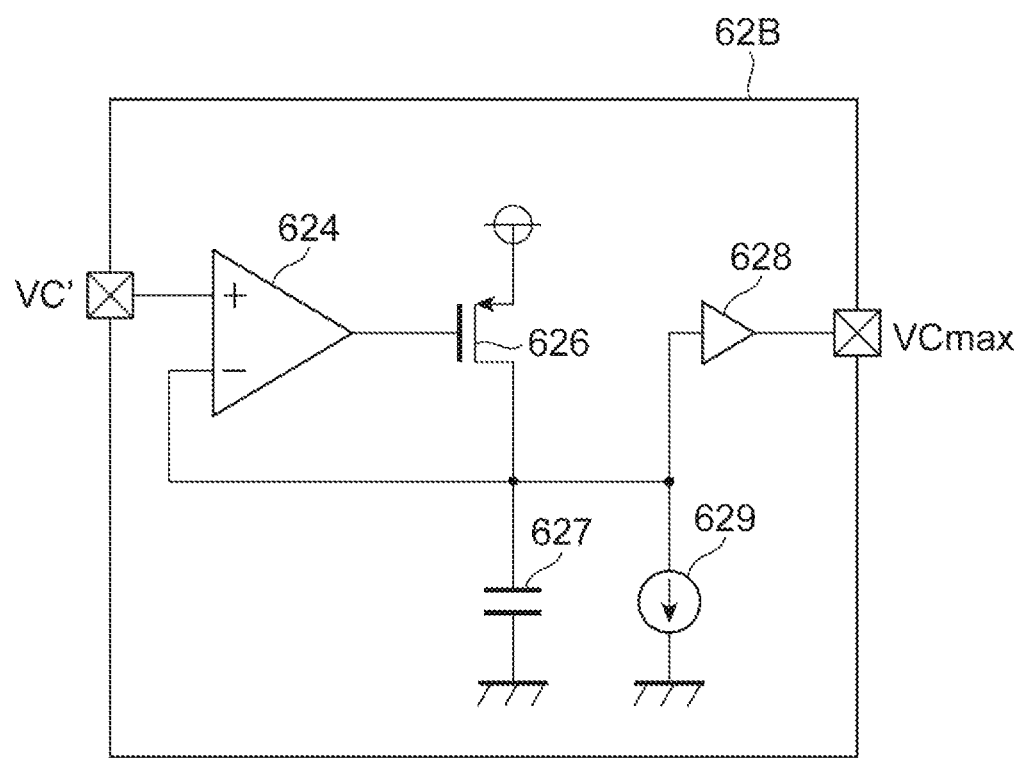
FIG. 8 is a diagram illustrating still another configuration example of the maximum value detection circuit.

FIG. 8 is a diagram illustrating still another configuration example of the maximum value detection circuit. A maximum value detection circuit 62B illustrated in FIG. 8 includes a differential amplifier 624, a PMOS transistor 626, a capacitor 627, a buffer 628, and a current source 629. The corrected voltage value VC' is taken in into a noninverting input terminal of the differential amplifier 624. An inverting input terminal of the differential amplifier 624 is connected to a drain of the PMOS transistor 626. An output terminal of the differential amplifier 624 is connected to a gate of the PMOS transistor 626. A source of the PMOS transistor 626 is connected to the power supply potential end. The capacitor 627 is disposed between the drain of the PMOS transistor 626 and the ground potential end. The current source 629 is disposed between the drain of the PMOS transistor 626 and the ground potential end. An input end of the buffer 628 whose gain is 1 is connected to the drain of the PMOS transistor 626. The buffer 628 outputs the potential of the drain of the PMOS transistor 626 as the maximum value VCmax.

Figure 9:
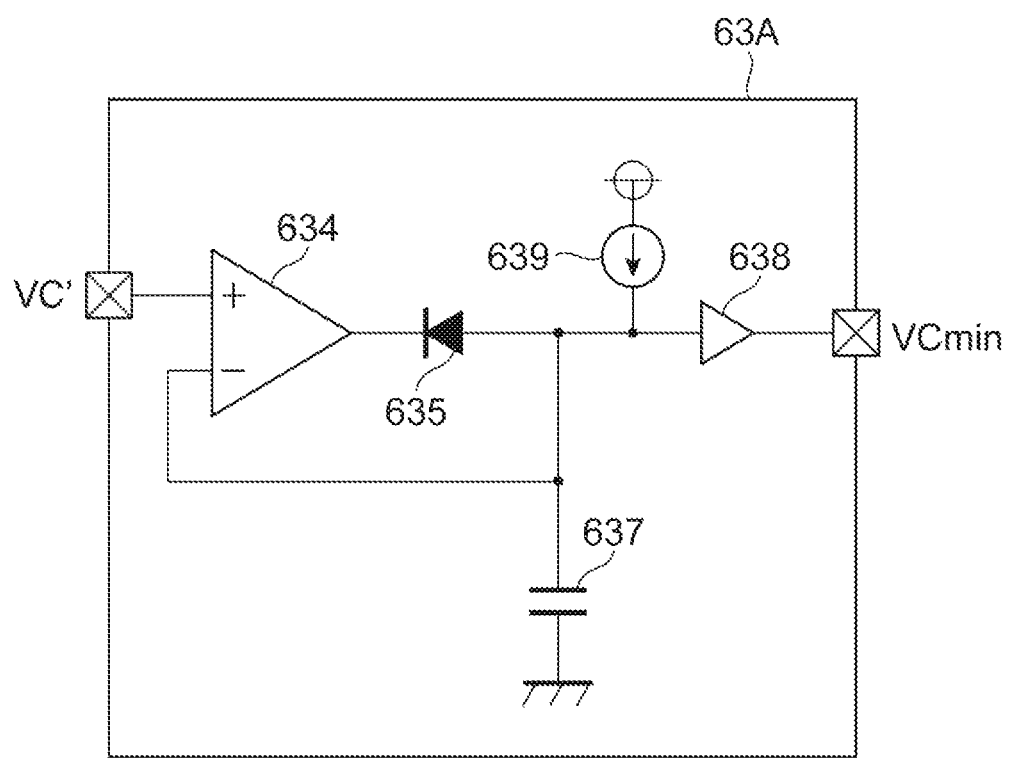
FIG. 9 is a diagram illustrating another configuration example of a minimum value detection circuit.

FIG. 9 is a diagram illustrating another configuration example of the minimum value detection circuit. A minimum value detection circuit 63A illustrated in FIG. 9 includes a differential amplifier 634, a diode 635, a capacitor 637, a buffer 638, and a current source 639. The corrected voltage value VC' is taken in into a noninverting input terminal of the differential amplifier 634. An inverting input terminal of the differential amplifier 634 is connected to an anode of the diode 635. An output terminal of the differential amplifier 634 is connected to a cathode of the diode 635. The capacitor 637 is disposed between the anode of the diode 635 and the ground potential end. The current source 639 is disposed between the anode of the diode 635 and the power source potential end. An input end of the buffer 638 whose gain is 1 is connected to the anode of the diode 635. The buffer 638 outputs the potential of the anode of the diode 635 as the minimum value VCmin.

Figure 10:
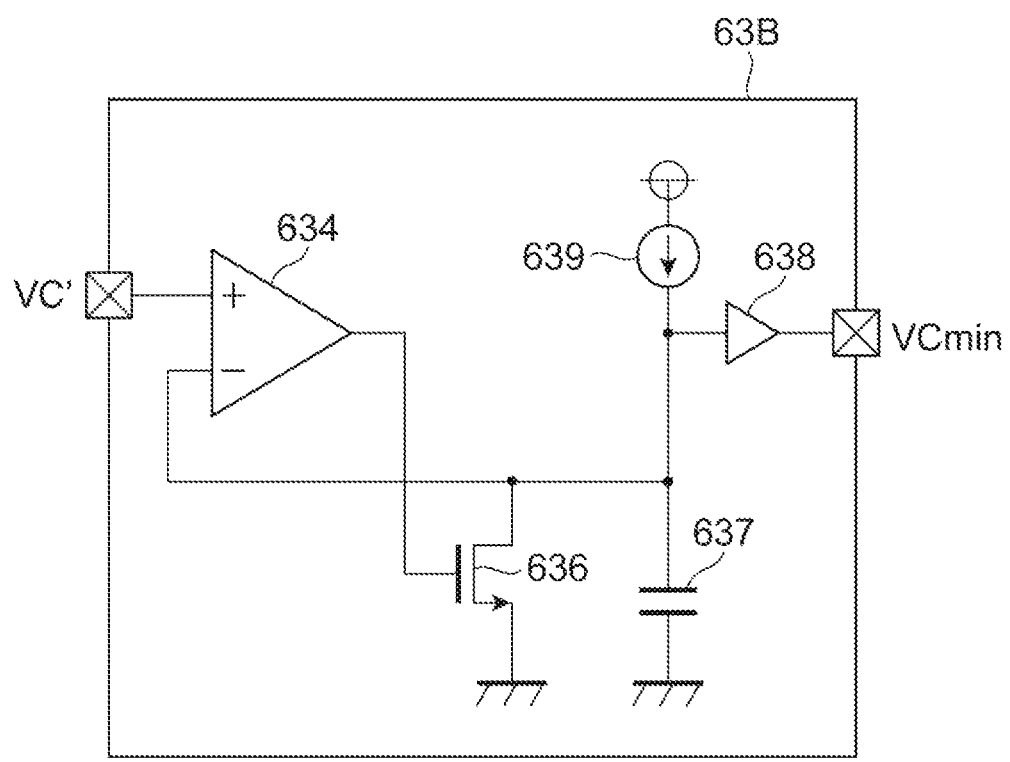
FIG. 10 is a diagram illustrating still another configuration example of the minimum value detection circuit.

FIG. 10 is a diagram illustrating still another configuration example of the minimum value detection circuit. A minimum value detection circuit 63B illustrated in FIG. 10 includes a differential amplifier 634, an NMOS transistor 636, a capacitor 637, a buffer 638, and a current source 639. The corrected voltage value VC' is taken in into a noninverting input terminal of the differential amplifier 634. An inverting input terminal of the differential amplifier 634 is connected to a drain of the NMOS transistor 636. An output terminal of the differential amplifier 634 is connected to a gate of the NMOS transistor 636. A source of the NMOS transistor 636 is connected to the ground potential end. The capacitor 637 is disposed between the drain of the NMOS transistor 636 and the ground potential end. The current source 639 is disposed between the drain of the NMOS transistor 636 and the power source potential end. An input end of the buffer 638 whose gain is 1 is connected to the drain of the NMOS transistor 636. The buffer 638 outputs the potential of the drain of the NMOS transistor 636 as the minimum value VCmin.

Figure 11:
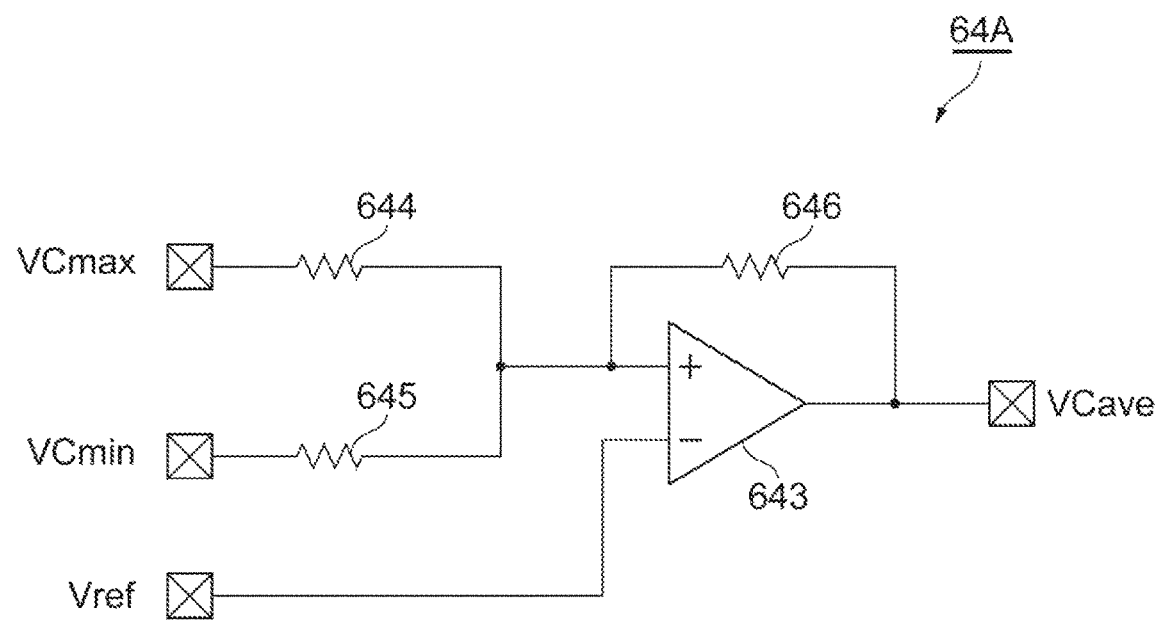
FIG. 11 is a diagram illustrating another configuration example of a mean value calculation circuit.

FIG. 11 is a diagram illustrating another configuration example of the mean value calculation circuit. A mean value calculation circuit 64A illustrated in FIG. 11 includes a differential amplifier 643 and resistors 644 to 646. The resistor 644 and the resistor 645 are connected in series. The maximum value VCmax is inputted to one end of the resistor 644, and the minimum value VCmin is inputted to one end of the resistor 645. A noninverting input terminal of the differential amplifier 643 is connected to a connection point between the resistor 644 and the resistor 645. The reference voltage value Vref is inputted to an inverting input terminal of the differential amplifier 643. The resistor 646 is disposed between the noninverting input terminal and an output terminal of the differential amplifier 643. A resistance value of the resistor 644 and a resistance value of the resistor 645 are equal to each other and ½ of a resistance value of the resistor 646. The mean value VCave is outputted from the output terminal of the differential amplifier 643.

A determination circuit which deter mines the mean value VCave outputted as an analog value from the mean value calculation circuit 64A may include a differential amplifier.

As described above, the PLL circuit according to the present embodiment is capable of more preferably setting the FV characteristic of the LC-VCO.

It is apparent from the above description of the present invention that the present invention can be variously modified. These modifications are not recognized as departing from the idea and range of the present invention. Improvements obvious to all skilled in the art are included in the following claims.

What is claimed is:

1. A PLL circuit comprising:
   a voltage controlled oscillator including a first input end provided to take in a control voltage value, an output end provided to output an oscillation signal having a frequency corresponding to the taken-in control voltage value, and a second input end provided to take in an FV characteristic control signal for adjusting an FV characteristic that determines a relationship between the frequency and the control voltage value, the voltage controlled oscillator including an inductor and a capacitor and being configured to generate the oscillation signal using a resonance phenomenon by the inductor and the capacitor,
   a phase comparator including a first input end proved to take in an input signal, a second input end electrically connected to the output end of the voltage controlled oscillator and provided to take in the oscillation signal or a signal obtained by frequency-dividing the oscillation signal as a feedback oscillation signal, and an output end provided to output a phase difference signal indicating a phase difference detected between the taken-in feedback oscillation signal and the taken-in input signal;
   a charge pump including an input end electrically connected to the output end of the phase comparator and provided to take in the phase difference signal, and an output end provided to output a corrected voltage value that reduces the phase difference indicated by the taken-in phase difference signal;
   a loop filter including an input end electrically connected to the output end of the charge pump and provided to take in the corrected voltage value, and an output end provided to output the control voltage value increased or reduced in response to variations in the taken-in corrected voltage value; and
   an FV characteristic adjustment unit including an input end electrically connected to the output end of the charge pump and provided to take in the corrected voltage value, and an output end electrically connected to the second input end of the voltage controlled oscillator and provided to output the FV characteristic control signal, the FV characteristic adjustment unit being configured to generate the FV characteristic control signal for adjusting the FV characteristic of the voltage controlled oscillator on the basis of a mean value of the taken-in corrected voltage value,
   wherein
   the FV characteristic adjustment unit outputs the FV characteristic control signal for adjusting the FV characteristic so that a difference between the mean value of the corrected voltage value and a reference voltage value becomes a predetermined threshold or less.

2. A PLL circuit comprising:
   a voltage controlled oscillator including a first input end provided to take in a control voltage value, an output end provided to output an oscillation signal having a frequency corresponding to the taken-in control voltage value, and a second input end provided to take in an FV characteristic control signal for adjusting an FV characteristic that determines a relationship between the frequency and the control voltage value, the voltage controlled oscillator including an inductor and a capacitor and being configured to generate the oscillation signal using a resonance phenomenon by the inductor and the capacitor;
   a phase comparator including a first input end provided to take in an input signal, a second input end electrically connected to the output end of the voltage controlled oscillator and provided to take in the oscillation signal or a signal obtained by frequency-dividing the oscillation signal as a feedback oscillation signal, and an output end provided to output a phase difference signal indicating a phase difference detected between the taken-in feedback oscillation signal and the taken-in input signal;
   a charge pump including an input end electrically connected to the output end of the phase comparator and provided to taken in the phase difference signal, and an output end provided to output a corrected voltage value that reduces the phase difference indicated by the taken-in phase difference signal;
   a loop filter including an input end electrically connected to the output end of the charge pump and provided to take in the corrected voltage value, and an output end provided to output the control voltage value increased or reduced in response to variations in the taken-in corrected voltage value; and
   an FV characteristic adjustment unit including an input end electrically connected to the output end of the charge pump and provided to take in the corrected voltage value, and an output end electrically connected to the second input end of the voltage controlled oscillator and provided to output the FV characteristic control signal, the FV characteristic adjustment unit being configured to generate the FV characteristic control signal for adjusting the FV characteristic of the voltage controlled oscillator on the basis of a mean value of the taken-in corrected voltage value,
   wherein
   the FV characteristic adjustment unit outputs the FV characteristic control signal for adjusting the FV characteristic so that the mean value of the corrected voltage value falls between a predetermined lower limit value and a predetermined upper limit value.

3. A PLL circuit comprising:
   a voltage controlled oscillator including a first input end provided to take in a control voltage value, an output end provided to output an oscillation signal having a frequency corresponding to the taken-in control voltage value, and a second input end provided to take in an FV characteristic control signal for adjusting an FV characteristic that determines a relationship between the frequency and the control voltage value, the voltage controlled oscillator including an inductor and a capacitor and being configured to generate the oscillation signal using a resonance phenomenon by the inductor and the capacitor, a phase comparator including a first input end provided to take in an input signal, a second input end electrically connected to the output end of the voltage controlled oscillator and provided to take in the oscillation signal or a signal obtained by frequency-dividing the oscillation signal indicating a phase difference detected between the taken-in feedback oscillation signal and the taken-in input signal;

a charge pump including an input end electrically connected to the output end of the phase comparator and provided to take in the phase difference signal, and an output end provided to output a corrected voltage value that reduces the phase difference indicated by the taken-in phase difference signal;

a loop filter including an input end electrically connected to the output end of the charge pump and provided to take in the corrected voltage value, and an output end provided to output the control voltage value increased or reduced to response to variations in the taken-in corrected voltage value; and an FV characteristic adjustment unit including an input end electrically connected to the output end of the charge pump and provided to take in the corrected voltage value, and an output end electrically connected to the second input end of the voltage controlled oscillator and provided to output the FV characteristic control signal, the FV characteristic adjustment unit being configured to generate the FV characteristic control signal for adjusting the FV characteristic of the voltage controlled oscillator on the basis of a mean value of the taken-in corrected voltage value, wherein the FV characteristic adjustment unit obtains a mean value of a maximum value and a minimum value of the corrected voltage value as the mean value of the corrected voltage value.

* * * * *